United States Patent [19]
Benhamida

[11] Patent Number: 5,093,633
[45] Date of Patent: Mar. 3, 1992

[54] EXTERNALLY TRIMMED INTEGRATED-CIRCUIT RC OSCILLATOR

[75] Inventor: Boubekeur Benhamida, Boise, Id.
[73] Assignee: Zilog, Inc., Campbell, Calif.
[21] Appl. No.: 658,004
[22] Filed: Feb. 20, 1991
[51] Int. Cl.[5] .......................... H03B 5/36; H03K 3/354
[52] U.S. Cl. .................. 331/59; 331/108 D; 331/111; 331/158
[58] Field of Search ................. 331/59, 108 C, 108 D, 331/111, 158

[56] References Cited
U.S. PATENT DOCUMENTS 3,324,415  6/1967  Sheffet ............................ 331/59 X
3,995,232  11/1976  Laugreen ........................... 331/111

Primary Examiner—Siegfried H. Grimm
Attorney, Agent, or Firm—Majestic, Parsons, Siebert & Hsue

[57] ABSTRACT

A circuit has a mask option for choosing between a crystal or an RC oscillator. The RC oscillator is completely fabricated on an integrated-circuit chip and includes a charging path, a discharging path, and a capacitor coupled at a node. The alternating charging and discharging of the node produces the oscillating output voltage signal at certain frequency. The oscillation frequency may be trimmed by coupling a single optional external resistor to either the charging or discharging paths, thereby reducing the output oscillation frequency.

11 Claims, 4 Drawing Sheets

EXTERNALLY TRIMMED INTEGRATED-CIRCUIT RC OSCILLATOR

BACKGROUND OF THE INVENTION

This invention relates to a novel integrated-circuit RC oscillator. More specifically, this invention relates to an RC oscillator which is entirely fabricated on an integrated-circuit chip, and has an output oscillation frequency which may be externally trimmed.

Oscillators are used in microprocessors to convert energy from a DC source into a cyclic energy which is usually supplied to the microprocessor clock. Crystal oscillators are sometimes employed to produce the desired oscillation frequency. While crystal oscillators produce good quality oscillating voltage signals, they are more expensive than most oscillators. Therefore, other types of less expensive oscillators have been used. In the past, RC oscillators were made having the passive resistive and capacitive elements positioned off the integrated-circuit chip because the elements occupied a considerable amount of semiconductor area. As semiconductor technology has advanced, it has been possible to position some of the resistive or capacitive elements on the IC chip.

It is oftentimes desirable for a user to be able to change the output voltage signal frequency of an oscillator after purchasing the oscillator. In order to do so, a user would purchase a new IC chip having an oscillator which produced the desired oscillation frequency. However, this method of modulation is expensive and inefficient. RC oscillators were then developed which included some resistive and capacitive elements off-chip so that the user could adjust the oscillating frequency. These oscillators were not entirely satisfactory, however, because the off-chip elements utilized too much space.

The difficulties in the preceding are not intended to be exhaustive but rather are many which may tend to reduce the usefulness of prior art RC oscillators. Other noteworthy problems may also exist; however, those presented above should be sufficient to demonstrate that RC oscillators appearing in the past will admit to worthwhile improvement.

It is therefore a general object of the invention to provide a novel RC oscillator which will obviate or minimize difficulties of the type previously described.

It is a specific object of the invention to provide an RC oscillator which produces an output voltage signal at an oscillating frequency which may be easily adjusted.

It is another object of the invention to provide an RC oscillator which minimizes the number of components which are external to the semiconductor chip on which the oscillator is fabricated.

It is still another object of the invention to provide an RC oscillator which is inexpensive and which provides a good quality voltage signal which consistently oscillates at a desired frequency.

SUMMARY OF THE INVENTION

One aspect of the invention which accomplishes at least some of the foregoing objects includes an integrated-circuit oscillator which has substantially all components fabricated on an integrated-circuit chip. The oscillator includes capacitor means for storing an electric charge, and a charging path through which the capacitor means is charged in a certain charge time. A discharging path permits the capacitor means to be discharged in an associated discharge time. The discharging path is separate from the charging path. An optional resistor is positioned externally to the IC chip and is coupled to either the charging path or the discharging path to permit adjustment of the charge time or discharge time, respectively, thereby altering output oscillation frequency.

DESCRIPTION OF THE DRAWINGS

Other advantages of the present invention will become apparent from the following detailed description of a preferred embodiment thereof taken in conjunction with the accompanying drawings, wherein.

DESCRIPTION OF A PREFERRED EMBODIMENT

Figure 1:
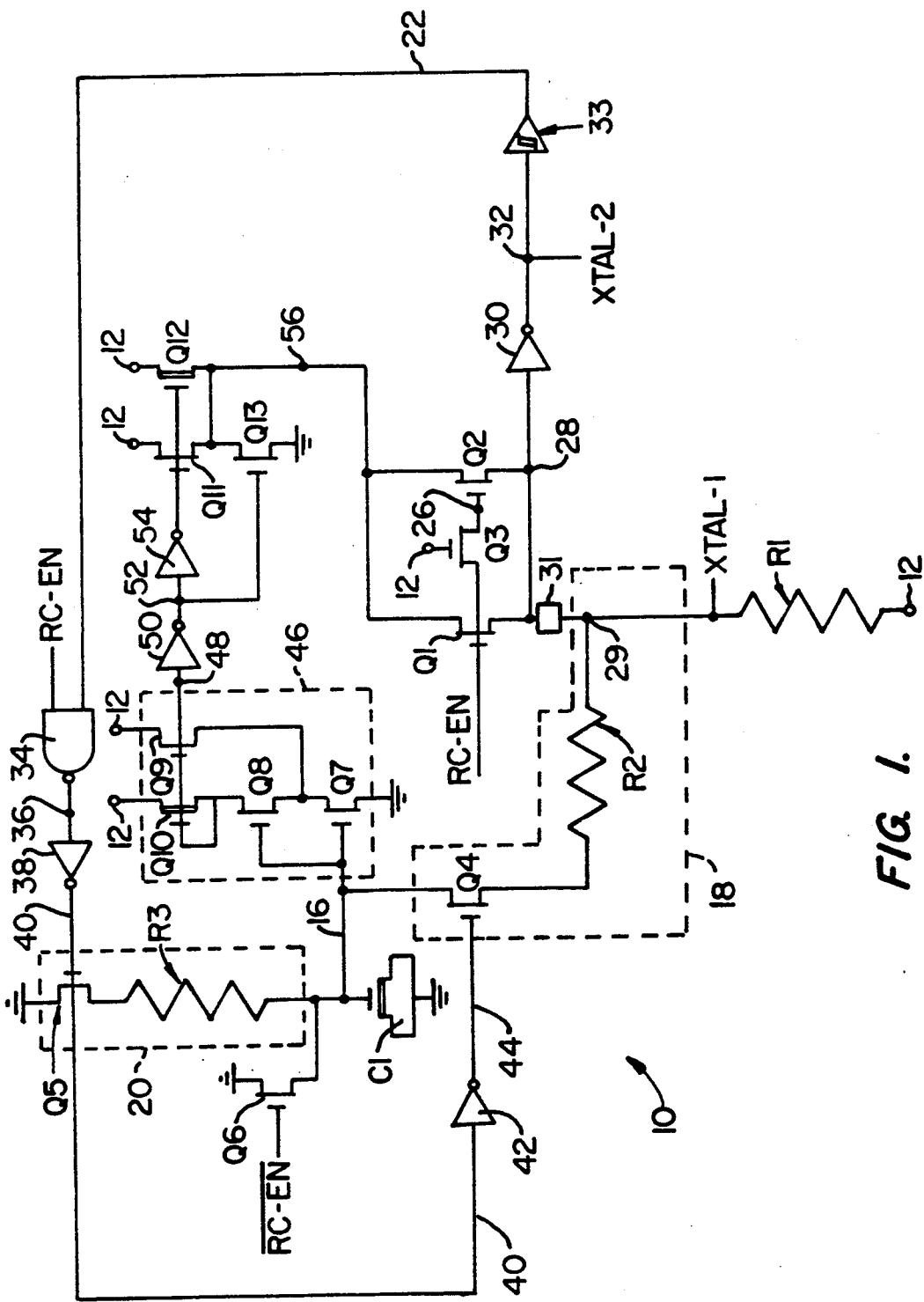
FIG. 1 is a schematic circuit diagram illustrating the integrated-circuit RC oscillator of the present invention.

Referring now to the drawings, shown in FIG. 1 is a circuit diagram of the RC oscillator circuit 10 of the present invention. The circuit is activated when an enable line RCEN, which is a ROM bit programmed by a user, is set into a "high" logic state. The circuit 10 is powered by a voltage supply 12 which supplies a VDD of about 5 volts DC in the preferred embodiment of the invention. The circuit 10 includes a depletion-mode transistor C1 which acts as a capacitor and charges line 16 through charge path 18. Line 16 is discharged via discharge path 20. The alternating charging and discharging of line 16 produces an oscillating output voltage signal at line 22. All components shown are implemented on a single semiconductor chip except an optional resistor R1 which, when used, reduces the frequency of oscillation of the circuit. The optional resistor R1 may be coupled to the charge path 18, as shown, or the discharge path 20 between a transistor Q5 and ground (not shown). The function of the resistor R1 will be explained in more detail below. All circuit components in the instant embodiment of the present invention are implemented using n-mos technology.

The oscillator circuit 10 is mask programmable and a user may choose between a crystal or an RC oscillator. A programmable n+diffusion 31 is coupled between a node 28 and a node 29. The diffusion 31 is formed, or not, depending on whether an RC or crystal oscillator operation is desired. The diffusion shorts node 28 to node 29 when the oscillator circuit 10 is in a crystal operating mode; the RC portion of the circuit is then not functioning. In the crystal mode, a crystal is coupled between pins XTAL-1 and XTAL-2, and the path formed along nodes 28, 29, and an inverter 30 permits feedback of the oscillating signal.

The functioning of the circuit in the RC oscillator mode will now be described. When the RC-EN line is set to a "high" logic state, the RC oscillator circuit 10 is enabled. Enhancement-mode transistor Q1 is conducting, or turned ON. Enhancement-mode transistor Q2 is coupled to enhancement-mode transistor Q3 at node 26, and is also turned ON since voltage supply 12 enables transistor Q3. The circuit is not initialized into any particular logic state, and so it will be assumed for explanatory purposes that the output of transistor Q2 at node 28 is a logic "high". An inverter 30 therefore outputs a logic "low" at node 32. A non-inverting Schmitt trigger 33 is included to reduce noise at the circuit output, which is taken at line 22. The input to NAND gate 34 at line 22 is thus a logic "low", producing a logic "high" at node 36. Inverter 38 inverts the signal to produce a logic "low" at output line 40, which is input to inverter 42 to produce a logic "high" at node 44. Thus, when node 28 is a logic "high", a logic "high" is also produced at node 44.

The charge path 18 includes enhancement-mode transistor Q4 and resistor R2. The charge path may be coupled to optional resistor R1, which is coupled to voltage supply 12. Presently, the circuit operation will be considered without the optional external resistor R1; node 29 will be considered to be connected directly to the voltage supply. The output oscillation frequency is highest when the optional resistor R1 is not coupled to the circuit 10. Since the voltage supply 12 is supplying a voltage, there is a voltage drop across resistor R2. Since line 44 is "high", transistor Q4 is conducting and enables transistor C1 to be charged up at line 16. The discharge path includes resistor R3, which has the same ohmic resistance as resistor R2, coupled to enhancement-mode transistor Q5. Since the input node 40 to transistor Q5 is a logic "low", Q5 is nonconducting and the charge stored at line 16 is not discharged at this time through the discharge path 20.

The charge time T1 of the charge path 18 is proportional to the time constant $TC1 = (C1)(R2)$. The discharge time T2 of the discharge path 20 is similarly proportional to the time constant $TC2 = (C1)(R3)$, and since R2=R3, TC1=TC2 in the absence of external resistor R1. Again, in this case the circuit 10 outputs its highest oscillation frequency. Note that node 16 is initially at a ground state when the oscillator circuit 10 is enabled since node 16 is coupled to transistor Q6, which is enabled by $\overline{RC\,EN}$. Transistor Q6 discharges node 16 to ground whenever the oscillator circuit 10 is not enabled.

Line 16 is coupled to an inverting Schmitt trigger 46 which has a hysteresis of approximately 1.2 volts, and an upper switch point V1 and a lower switch point V2. Schmitt trigger 46 includes enhancement-mode transistors Q7, Q8, and Q9, and depletion-mode transistor Q10. When line 16 reaches the upper switch point V1 of Schmitt trigger 46, the output at node 48 goes "low". Inverter 50 thus outputs a logic "high" at node 52. The output of inverter 54 is a logic "low", and line 56 is also logic "low". Thus, the logic state of line 56 is the inverse of line 16.

Transistors Q2 and Q3 act as a bootstrap and output a logic "low" at node 28 when line 56 is a "low". (When node 56 is a logic "high", node 28 is also at a logic "high" without any threshold loss across transistor Q2 due to the bootstrap circuit formed by transistors Q2 and Q3.) The output of inverter 30 is therefore a logic "high" at node 32, and remains a logic "high" after passing through the non-inverting Schmitt trigger 33.

A logic "low" is output at node 44, starting the other half of an oscillating cycle and disabling the charge path 18 since transistor Q4 is nonconducting. Transistor Q5 conducts because input line 40 is "high". During this second half of the oscillating cycle, node 16 discharges toward ground with a time constant $TC2 = (R3)(C1)$ until it reaches the lower switch point V2 of Schmitt trigger 46. The Schmitt trigger then outputs a logic "high" at node 48, and node 56 become a logic "high". The output at line 22 is then a logic "low" and one oscillation cycle has been completed. The cycle then begins again.

Figure 2:
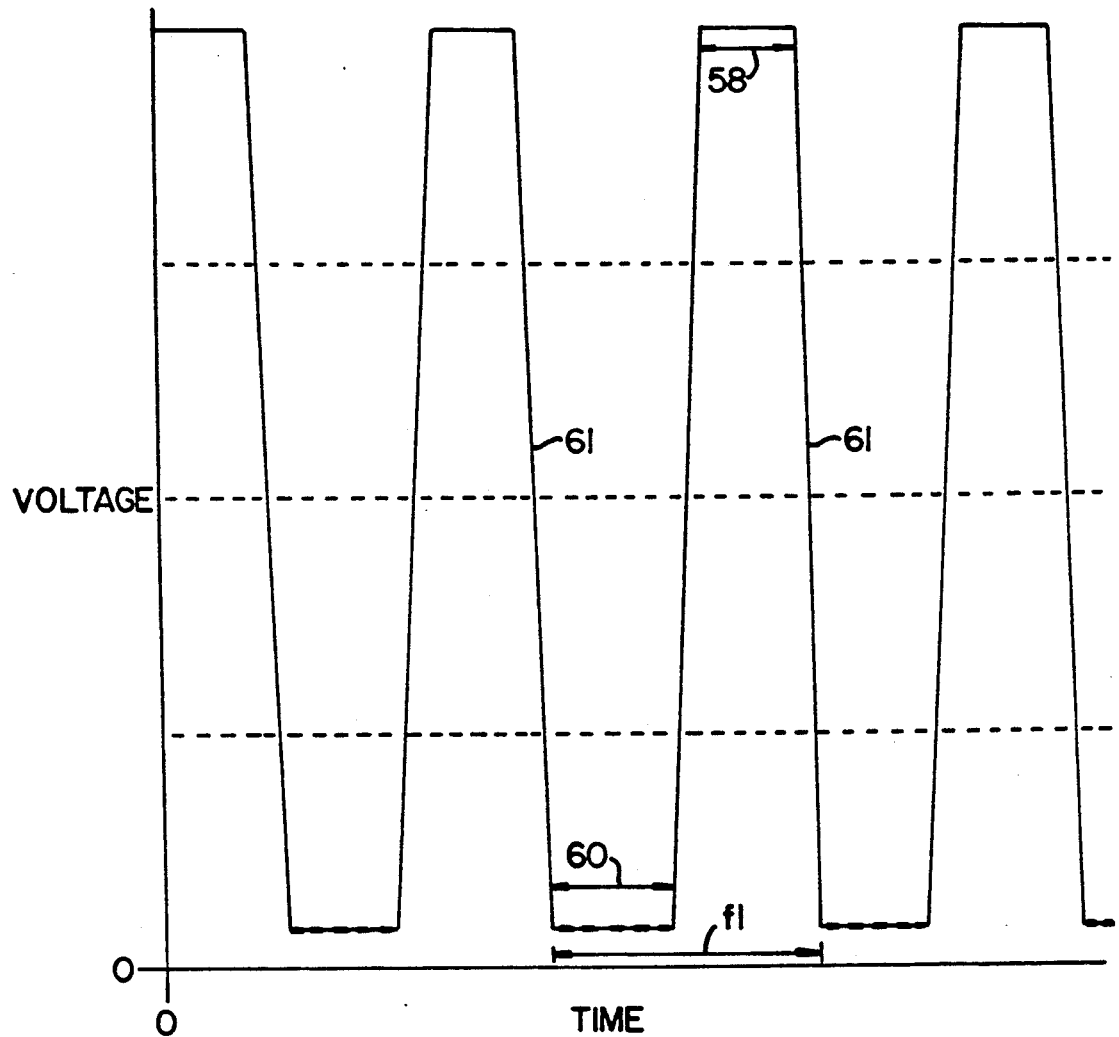
FIG. 2 is a graphical illustration showing the oscillation frequency of the circuit of FIG. 1 with no external resistor coupled to the oscillator.
Figure 3:
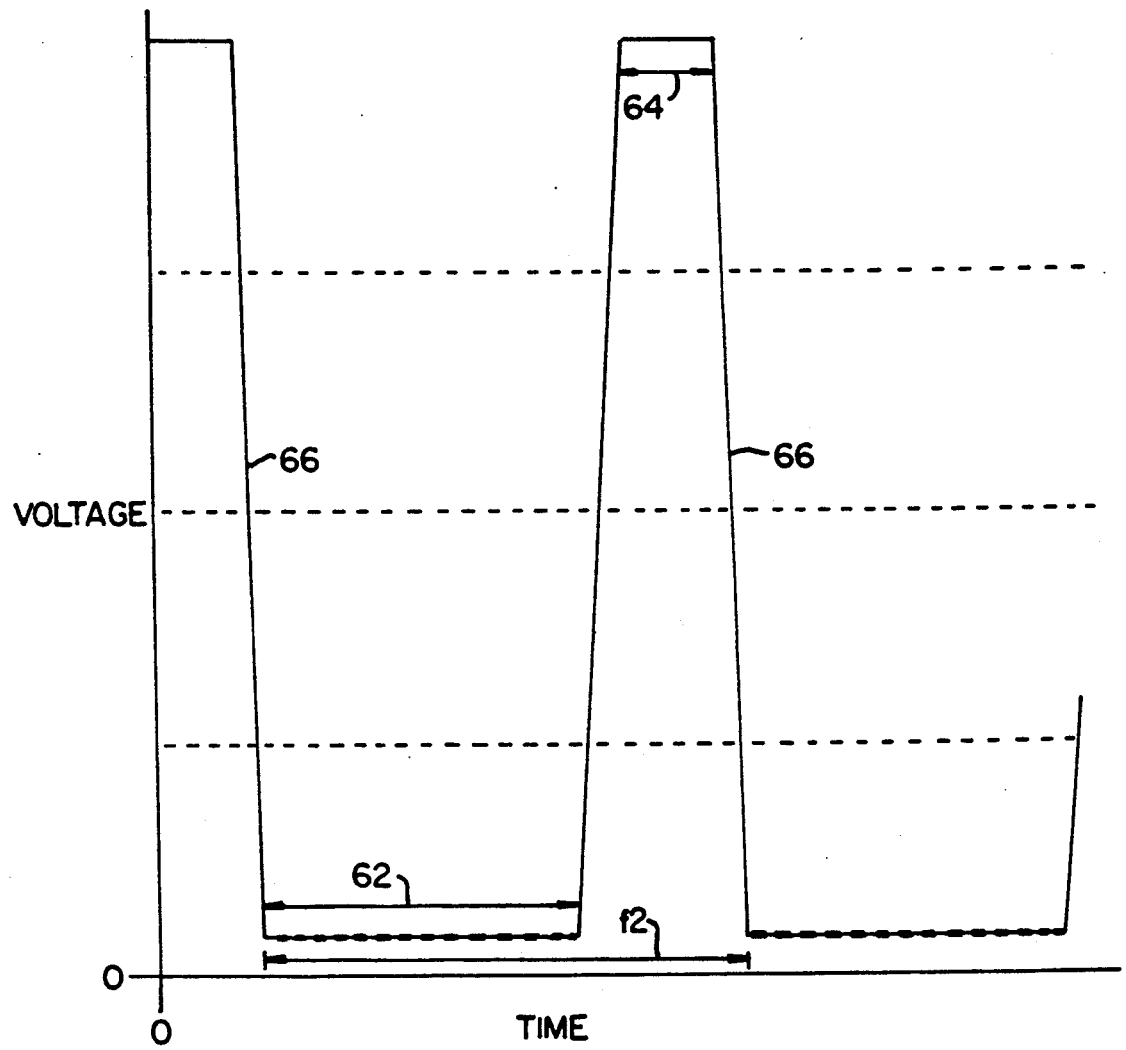
FIG. 3 is a graphical illustration showing the oscillation frequency of the circuit of FIG. 1 with an external resistor coupled to the oscillator.

FIG. 2 illustrates the output of the circuit taken at line 22 in the absence of optional external resistor R1. The abscissa of FIGS. 2 and 3 is time, and the ordinate is voltage. The scales in both figures are the same. As can be seen, the time extent of the high output 58 is equal to the time extent of the low output 60. The output shown goes through a flip-flop (not shown) to obtain a 50% duty cycle before being delivered to a microprocessor. The flip-flop output is triggered on the leading edge 61 of the signal to produce the output oscillation. The flip-flop output is a square wave with symmetrical half-cycles even when the oscillator circuit output at line 22 is not. The oscillator circuit frequency is highest when no external resistor is coupled to the charge or discharge paths, and is shown as f1 and FIG. 2.

Referring again to FIG. 1, the output oscillation frequency may be reduced by coupling optional external resistor R1 between the voltage supply 12 and the crystal pin XTAL-1, as shown. By adding the resistor R1, the time constant of the charge path 18 increases to $T1 = (R1 + R2)(C1)$. The time constant of the discharge path remains $T2 = (R3)(C1)$, where R3=R2. Therefore, $T2 = (R2)(C1)$, which is less than T1. Since the time it takes to charge line 16 will be longer than the time it takes to discharge the line, the circuit oscillation frequency is reduced.

FIG. 3 shows the output of the circuit taken at line 22 when the external resistor R1 is coupled to the charge path. Since it takes longer for line 16 to be adequately charged, the circuit is charging for a longer time than it was when no external resistor was coupled to the circuit 10. The time extent 62 shows when the output is a low voltage, and is much longer than the time extent 64 at which the output is at a high voltage. Since the flip-flop output is triggered at leading edge 66, the oscillation frequency is lower than in FIG. 2. A comparison of FIGS. 2 and 3 illustrates that the oscillation frequency f2 is lower than f1.

Figure 4:
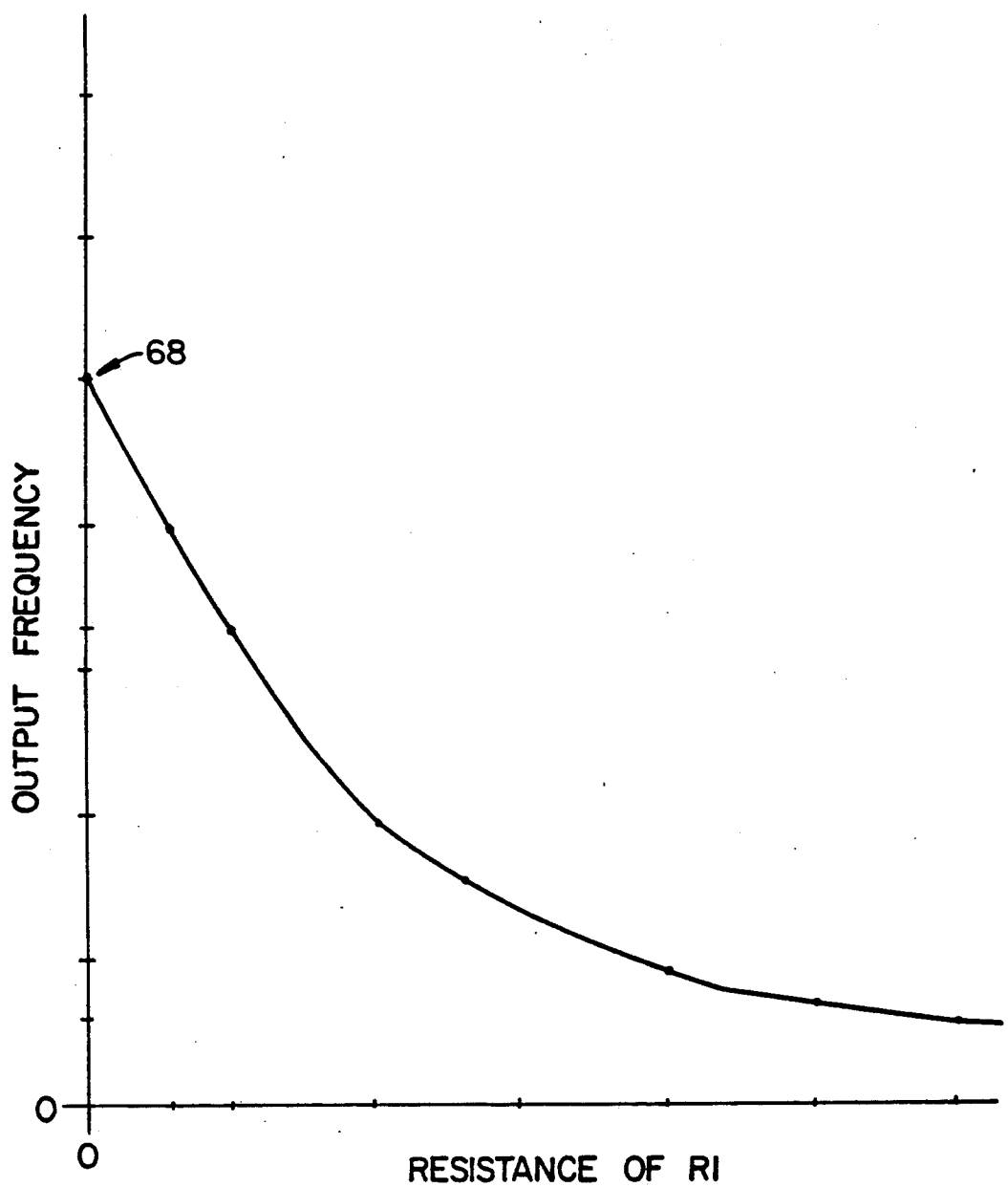
FIG. 4 is a graphical illustration of the characteristics of the RC oscillator of FIG. 1.

FIG. 4 is a graph illustrating the resistance of R1 along the abscissa, versus the oscillator circuit output frequency along the ordinate. The graph shows that the highest output frequency is obtained when R1=0, shown at point 68, or when no external resistor is coupled to the oscillator circuit. The output frequency may be trimmed as desired by coupling an R1 having the appropriate resistance to thereby obtain the desired oscillation frequency.

After reading and understanding the foregoing inventive RC oscillator circuit, in conjunction with the drawings, it will be appreciated that several distinct advantages of the subject invention are obtained. All components necessary to obtain the highest oscillation frequency are internal to an integrated-circuit chip. If a reduced oscillation frequency is desired, a user simply couples an external resistor R1 to either the charging or discharging paths. The mask programmable option renders the circuit versatile, and the RC oscillator circuit is inexpensive. The circuitry is simple to fabricate on an integrated-circuit chip, and the number of external circuit components is minimized to the single external resistor, and is necessary only when a trimmed frequency is desired.

It should be noted that although the invention has been described with reference to a specific embodiment, it should not be construed to be so limited. For instance, the transistors shown are implemented using MOSFETs, but they could be replaced with junction field effect or bipolar junction transistors. The circuit may be altered to employ cmos or p-mos technology, and the voltage supply could be replaced with a current supply. Transistor C1 could be replaced with a different type of capacitive element. Those skilled in the art and familiar with the instant disclosure of the subject invention may recognize additions, deletions, modifications, substitutions and other changes which will fall within the purview of the subject invention and claims.

It is claimed:

1. An RC oscillator comprising:
capacitor means for storing electric charge, said capacitor means being fabricated on an integrated-circuit chip;
a charging path through which said capacitor means is charged and having a charging time during which said capacitor means is operably charged, said charging path being fabricated on an integrated-circuit chip;
a discharging path through which said capacitor means is discharged, said discharging path being separate from said charging path, said discharging path having a discharging time during which said capacitor means is operably discharged, said discharging path being fabricated on an integrated-circuit chip;
wherein said discharging time and said charging time affect an output voltage signal frequency of said integrated-circuit oscillator, the maximum frequency of oscillation being obtained when said charging time is equal to said discharging time; and
a resistor being positioned external to said integrated-circuit chip, said resistor being coupled to either said charging path or said discharging path, said resistor increasing said charging time or said discharging time, respectively, thereby resulting in a frequency of oscillation which is below said maximum frequency of oscillation.

2. An adjustable frequency oscillator circuit formed on an integrated-circuit chip, comprising:
a capacitor,
a resistive charge path connectable between said capacitor and a first terminal of a voltage supply,
a resistive discharge path connectable between said capacitor and a second terminal of a voltage supply,
means connected to either said charge or said discharge paths for allowing the resistance thereof to be increased by connection of a separate resistance external to said integrated-circuit chip, whereby the frequency of the oscillator circuit may be controlled.

3. The oscillator circuit according to claim 2 wherein the value of resistances in each of the charge and discharge paths formed on the integrated-circuit chip are substantially equal.

4. The oscillator circuit according to claim 2 which additionally includes the separate external resistance connected as part of either said charge or said discharge path.

5. The oscillator circuit according to claim 3 which additionally includes the separate external resistance connected as part of either said charge or said discharge path, whereby the charge and discharge paths have unequal resistances.

6. The oscillator circuit according to claim 2 wherein said resistance increasing means includes connection of either said charge or said discharge paths to a pin of said integrated-circuit to which said external resistance may be connected.

7. An adjustable frequency oscillator circuit formed on an integrated-circuit chip, comprising:
a capacitor,
means including a first resistance connectable across said capacitor for discharging the capacitor during discharge portions of oscillating cycles, whereby relative values of the capacitor and the first resistance control the time required to discharge the capacitor, and
means including a second resistance connectable between said capacitor and a pin of said circuit chip for charging the capacitor during charge portions of oscillating cycles from a voltage provided to said pin, whereby relative values of the capacitor and a combination of the second resistance and a third resistance connected external of the chip between the pin and a voltage supply control the time required to charge the capacitor.

8. The oscillator according to claim 7, wherein said first and second resistances are of substantially equal values.

9. The oscillator according to claim 8 which additionally includes said third resistance connected between said pin and said voltage supply, thereby causing the time required to charge the capacitor to exceed the time required to discharge the capacitor.

10. The oscillator according to claim 8 wherein said pin is connected directly to said voltage supply, thereby causing said third resistance to be substantially zero, whereby the times required to charge and discharge the capacitor are substantially equal.

11. The oscillator according to claim 7 which additionally comprises a mask programmable means on said integrated-circuit chip for disabling the adjustable frequency oscillator and allowing connection therewith of a oscillator external to said chip.

* * * * *